(12) United States Patent
Matsunaga et al.

(10) Patent No.: US 6,927,165 B2
(45) Date of Patent: Aug. 9, 2005

(54) METHOD AND APPARATUS FOR PROCESSING SUBSTRATES AND METHOD FOR MANUFACTURING A SEMICONDUCTOR DEVICE

(75) Inventors: Tatsuhisa Matsunaga, Tokyo (JP); Masahiro Teramoto, Tokyo (JP); Norio Akutsu, Tokyo (JP); Kouichi Noto, Tokyo (JP)

(73) Assignee: Hitachi Kokusai Electric, Inc., Tokyo (JP)

( * ) Notice: Subject to any disclaimer, the term of this patent is extended or adjusted under 35 U.S.C. 154(b) by 113 days.

(21) Appl. No.: 10/674,345

(22) Filed: Oct. 1, 2003

(65) Prior Publication Data

US 2004/0177926 A1 Sep. 16, 2004

Related U.S. Application Data

(62) Division of application No. 09/963,382, filed on Sep. 27, 2001, now Pat. No. 6,638,860.

(30) Foreign Application Priority Data

Sep. 27, 2000 (JP) .................................. 2000-294176
Oct. 30, 2000 (JP) .................................. 2000-330968
May 2, 2001 (JP) .................................. 2001-134821

(51) Int. Cl.$^7$ .................. H01L 21/44; H01L 21/31; H01L 21/1469; C23C 16/00

(52) U.S. Cl. ................... 438/684; 438/264; 118/719
(58) Field of Search .................. 438/488, 684, 438/764, 909; 118/115, 719; 414/217, 806, 937; 356/369

(56) References Cited

U.S. PATENT DOCUMENTS

| | | | | |
|---|---|---|---|---|
| 4,835,114 A | * | 5/1989 | Satou et al. | 438/488 |
| 5,062,771 A | * | 11/1991 | Satou et al. | 417/201 |
| 5,447,294 A | * | 9/1995 | Sakata et al. | 266/257 |
| 5,462,397 A | * | 10/1995 | Iwabuchi | 414/217 |
| 6,331,890 B1 | * | 12/2001 | Marumo et al. | 356/369 |
| 6,638,860 B2 | * | 10/2003 | Matsunaga et al. | 438/684 |
| 6,641,350 B2 | * | 11/2003 | Nakashima et al. | 414/217 |

* cited by examiner

Primary Examiner—Michael Lebentritt
Assistant Examiner—Walter L. Lindsay, Jr.
(74) Attorney, Agent, or Firm—Bacon & Thomas

(57) ABSTRACT

A substrate processing apparatus includes a housing, a process tube for performing variable batch processes on substrates, and product substrate carriers. The product substrate carriers have a capacity of a predetermined number of substrates. A number of the product substrates processed during one batch process are less than or equal to the predetermined number of the substrates. All of the product substrates contained in one product substrate carrier is processed in the process tube at a same time.

17 Claims, 9 Drawing Sheets

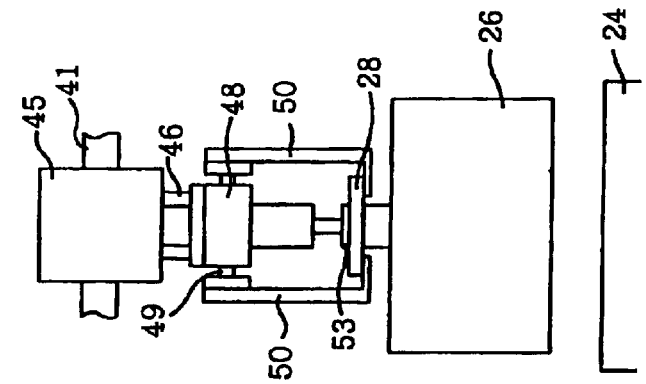
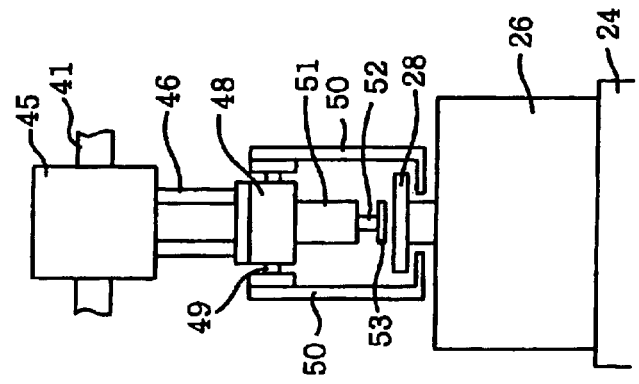
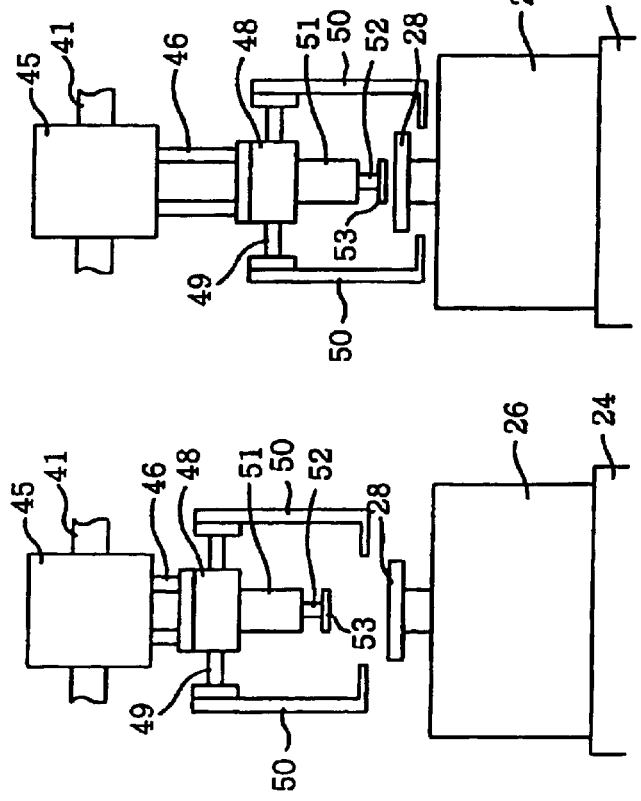

METHOD AND APPARATUS FOR PROCESSING SUBSTRATES AND METHOD FOR MANUFACTURING A SEMICONDUCTOR DEVICE

CROSS REFERENCE TO RELATED APPLICATIONS

This application is a divisional application of U.S. application Ser. No. 09/963,382, filed Sep. 27, 2001 now U.S. Pat. No. 6,638,860 (of which the entire disclosure of the prior application is hereby incorporated by reference), which has been allowed and the Issue Fee paid on Sep. 3, 2003.

FIELD OF THE INVENTION

The present invention relates to a method and an apparatus for processing substrates and a method for manufacturing semiconductor devices; and, more particularly, to a substrate processing apparatus adequate for processing a small number of substrates at a time at reduced costs and methods for processing substrates and manufacturing semiconductor devices by using the substrate processing apparatus.

BACKGROUND OF THE INVENTION

In manufacturing integrated circuit (IC) devices, a batch type vertical diffusion and chemical vapor diffusion (CVD) system (hereinafter, "a batch-type CVD system") is widely used to diffuse impurities onto wafers or to form on the wafers CVD films such as insulating films, metal films or the like.

In substrate processing apparatuses including the batch-type CVD system, a plurality of wafers are transferred while being contained in a carrier. Two kinds of carriers have been conventionally used. One is a box-shaped cassette having a pair of openings on two opposite sides thereof and the other is a box-shaped FOUP (front opening unified pod; hereinafter, "pod") having an opening on one side thereof with a pod door removably mounted thereon. When the pod is used as a carrier for the wafers, the wafers can be kept protected from contaminations of ambient atmosphere while being transferred since the pod containing the wafers is airtightly closed. Accordingly, the requirement of cleanliness for a clean room in which the substrate processing apparatus is installed can be relaxed, thereby reducing the cost for maintenance of the clean room. For such reasons, the pod is gaining popularity as a wafer carrier in the batch-type CVD system recently.

In general, a batch-type CVD system having a pod as a wafer carrier includes a process tube for performing a desired process to wafers, a boat for loading/unloading a plurality, e.g. 150 sheets, of wafers into/from the process tube, a wafer loading port for supporting one or more pods while the wafers are transferred between the pods and the boat, a pod stage for placing thereon pods unloaded from and to be introduced into the CVD system, pod shelves for temporarily storing pods and a pod transfer device for conducting pod transfer between the pod stage and the pod shelves and between the pod shelves and the wafer loading port.

In such a batch-type CVD system described above, the pods are carried to the pod stage and then transferred by the pod transfer device to the pod shelves to be temporarily kept thereon. Then, a plurality of pods kept on the pod shelves are transferred to the wafer loading port through repetitive operations of the pod transfer device. Thereafter, the wafers contained in the pods are charged into the boat by the wafer transfer device and then the boat is loaded into the process tube in which the wafers are processed. The processed wafers are unloaded from the process tube and discharged from the boat to be carried into the empty pods waiting on the wafer loading port through the repetitive operations of the wafer transfer device. The pods containing the processed wafers therein are repeatedly transferred to the pod stage by the pod transfer device after being temporarily kept on the pod shelves.

Recently, in manufacturing large scale integration (LSI) devices or the like, a quick turned around time (QTAT) type production, in which the required time from input of wafers to finish is as shortened as possible, is gaining importance. The QTAT manufacturing method has increased a demand for a small-batch type CVD system suitable for processing 25 sheets or less of wafers during one batch process, i.e., for a small batch process. Such a small-batch type CVD system requires only two or three pods for one batch process.

However, the above described conventional batch-type CVD system is suitable for a large batch dealing with a large number, e.g., 150 sheets, of substrates during one batch process. Accordingly, the footprint required for the pod shelves or the number of layers of each pod shelf should be increased or the shelves should be built to be rotatable so as to accommodate many pods thereon. Thus, the use of such a conventional batch-type CVD system for a small batch process would end up with the unnecessarily large and complicated system. Further, initial costs or running costs of the system would also be unnecessarily increased. Still further, the conventional batch-type CVD system cannot fully meet requirements of the QTAT type production.

SUMMARY OF THE INVENTION

It is, therefore, an object of the present invention to provide a substrate processing apparatus suitable for batch-processing a small number of substrates at reduced costs and methods for processing the substrates and manufacturing semiconductor devices by using the substrate processing apparatus.

In accordance with an aspect of the present invention, there is provided a substrate processing apparatus, comprising: a housing, a process tube being located in the housing for performing variable batch processes on substrates, the substrates including product substrates which are used for manufacturing final products, and product substrate carriers for transferring the product substrates, the product substrate carriers having a capacity of a predetermined number of substrates, wherein a number of the product substrates processed during one batch process are set to be less than or equal to the predetermined number of the substrates and all of the product substrates contained in one product substrate carrier is processed in the process tube at a same time.

In accordance with a second aspect of the present invention, there is provided a method for performing a predetermined batch process to substrates, the substrates including product substrates which are used for manufacturing final products, the method comprising the steps of: transferring the product substrates by using product substrate carriers, the product substrate carriers having a capacity of a predetermined number of substrates, and performing the predetermined batch process on the product substrates, wherein a number of the product substrates processed during the predetermined batch process are set to be less than or equal to the predetermined number of the substrates and all of the product substrates contained in one product substrate carrier is processed in the predetermined batch process.

BRIEF DESCRIPTION OF THE DRAWINGS

The above and other objects and features of the present invention will become apparent from the following description of preferred embodiments given in conjunction with the accompanying drawings, in which:

FIGS. 5A to 5D illustrate front views for explaining pod transferring processes performed by the pod transfer device in accordance with the first embodiment of the present invention;

DETAILED DESCRIPTION OF THE PREFERRED EMBODIMENTS

First, a substrate processing apparatus in accordance with a first embodiment of the present invention will be described hereinafter.

The substrate processing apparatus of the first preferred embodiment is a small-batch type vertical diffusion and CVD system (hereinafter, "a small-batch type CVD system") which processes a small number, e.g., about 50 sheets or less, of substrates during one batch process. The small-batch type CVD system processes or treats product wafers serving as substrates for producing actual device products thereon and uses pods as carriers therefor. In the following descriptions, a front, a rear, a left and a right side are defined with reference to FIG. 2, wherein the front side refers to where a pod opener 21 is located; the left side refers to where a clean unit 17 is installed; and the rear side and the right side respectively refer to an area opposite to the front side and the left side.

Figure 1:
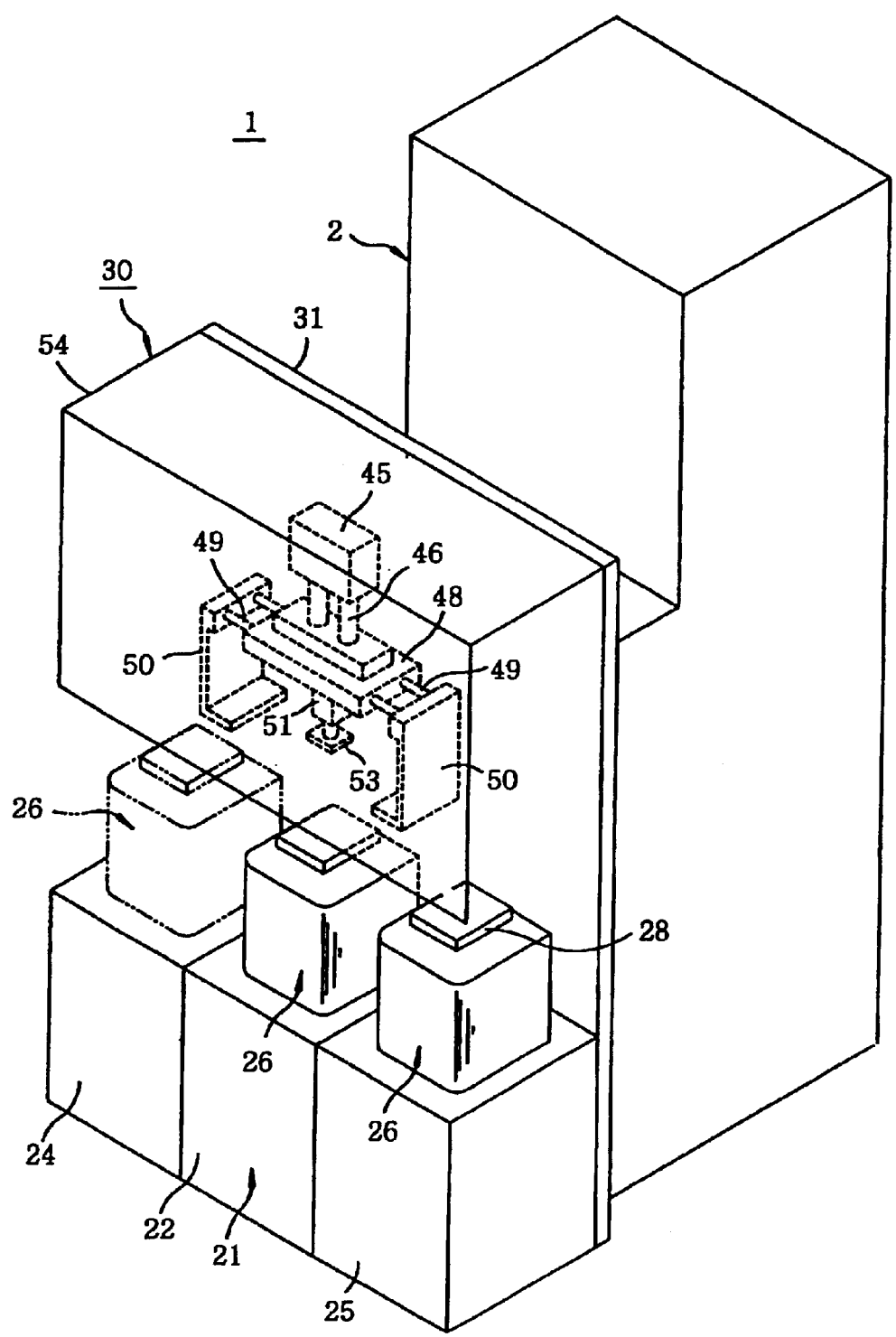
FIG. 1 is a perspective view of a small-batch type CVD system in accordance with a first embodiment of the present invention.
Figure 2:
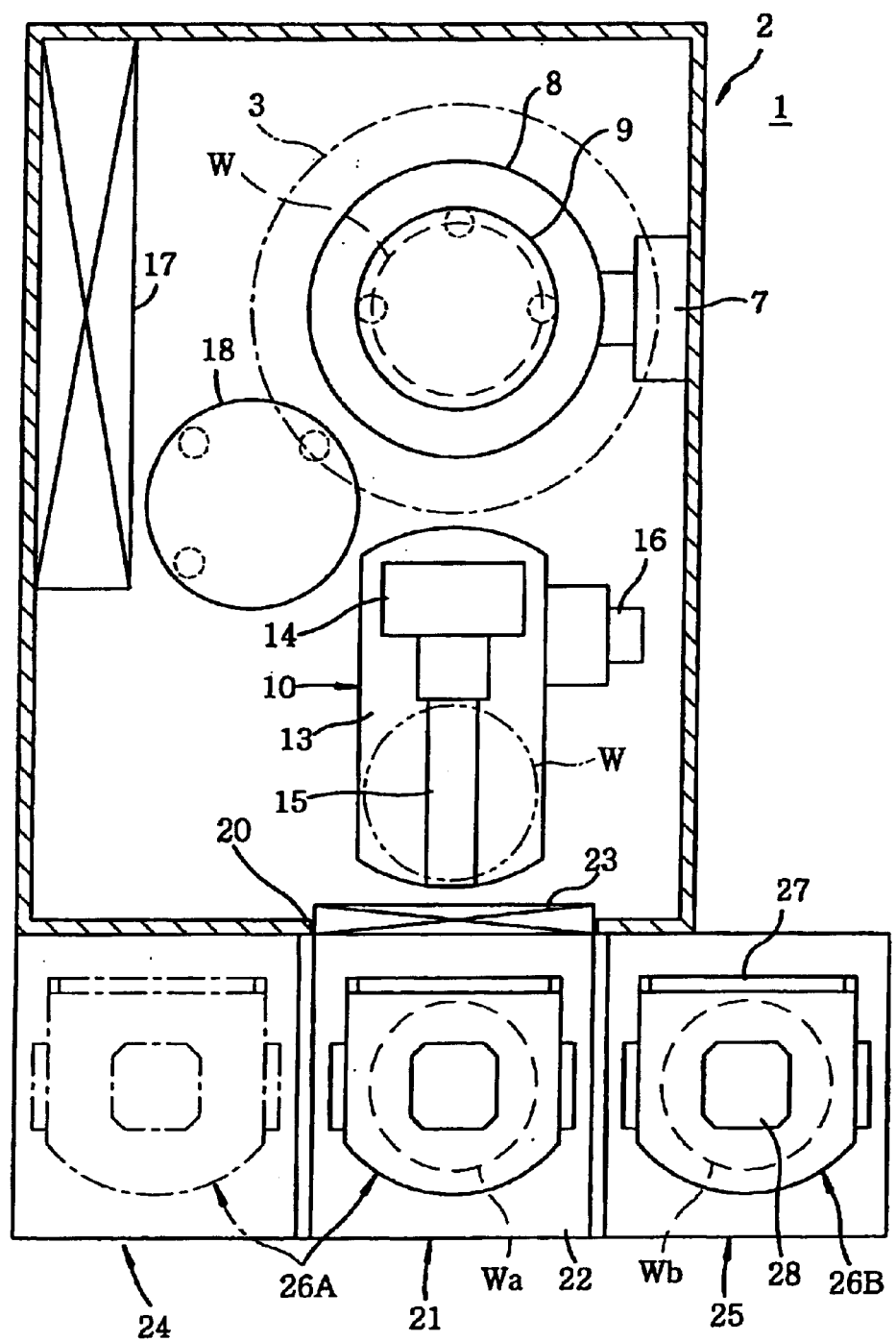
FIG. 2 provides a plan view of the small-batch type CVD system shown in FIG. 1.
Figure 3:
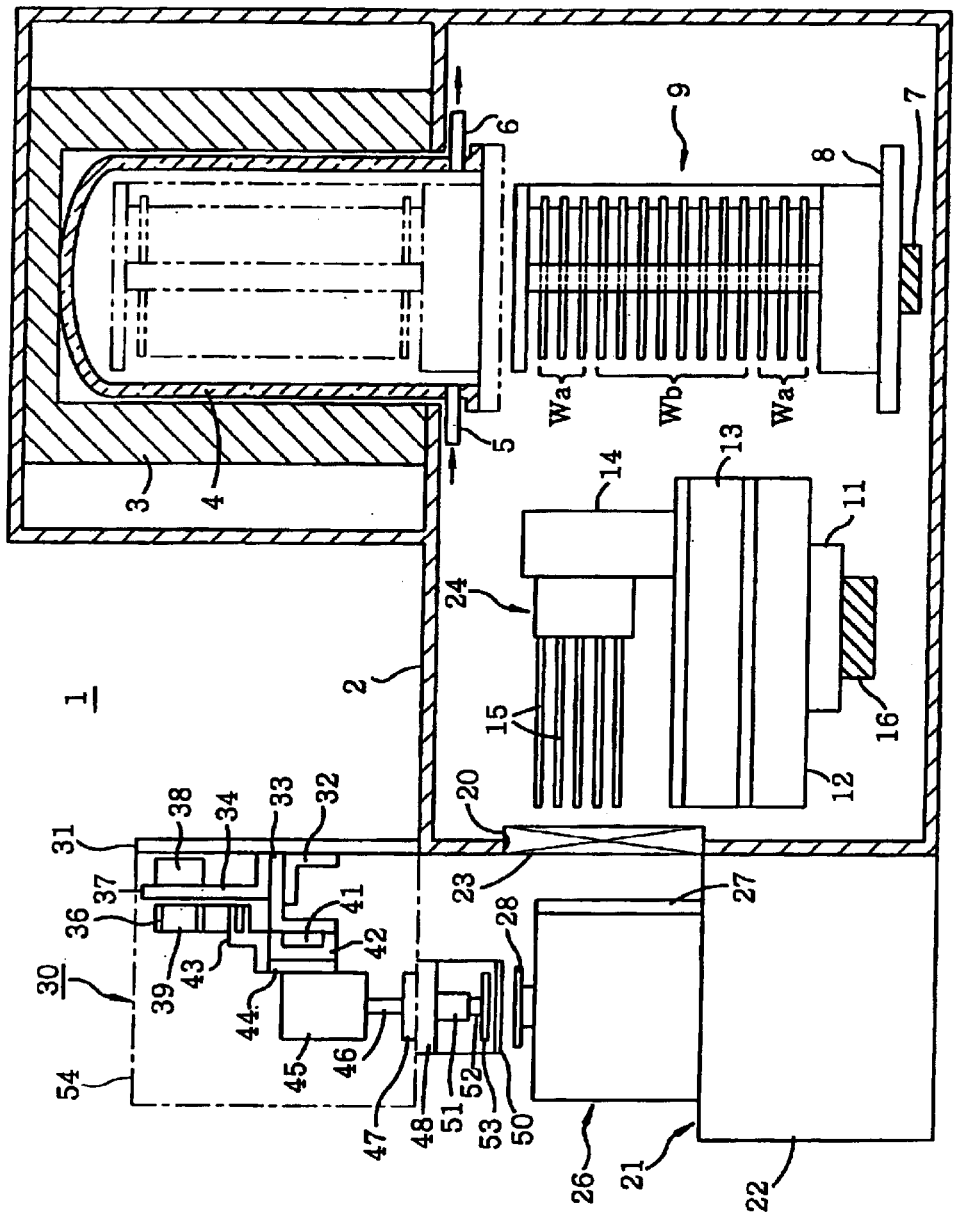
FIG. 3 depicts a cross-sectional view of the small-batch type CVD system shown in FIG. 1.

As shown in FIGS. 1 to 3, the small-batch type CVD system 1 includes a housing 2, a heater unit 3 and a process tube 4. The heater unit 3 is vertically installed at an upper portion of the rear side of the housing 2 and the process tube 4 is concentrically disposed within the heater unit 3. The process tube 4 has a gas supply pipe 5 for supplying a process gas or a purge gas into the process tube 4, and an exhaust pipe 6 for evacuating the process tube 4.

Disposed at a lower portion of the rear side of the housing 2 is an elevator 7 with feed screw elements or the like. The elevator 7 allows a sealing cap 8 horizontally installed below the process tube 4 to move up and down. The sealing cap 8 airtightly seals a throat of the process tube 4, i.e., an opening at a lower part of the process tube 4, and vertically supports a boat 9. The boat 9 accommodates a plurality, e.g., less than or equal to about 50 sheets, of wafers (W) and arranges the wafers (W) in such a manner that the centers of the wafers are vertically aligned while keeping the wafers parallel to each other. The wafers are loaded into or unloaded from the process tube 4 as the boat is moved up or down by the elevator 7.

Referring to FIGS. 2 to 3, at the front region of the housing 2 is installed a wafer transfer device 10 for charging and discharging the wafers (W) into and from the boat 9. The wafer transfer device 10 has a rotary actuator 11, which circularly moves a first linear actuator 12 in a horizontal plane. The first linear actuator 12 is installed on a top surface of the rotary actuator 11. Placed on a top surface of the first linear actuator 12 is a second linear actuator 13, which is translationally moved in a horizontal plane by the first linear actuator 12. On a top surface of the second linear actuator 13 is installed a moving stage 14, which is horizontally and translationally moved by the second linear actuator 13. The moving stage 14 has plural sets of tweezers 15 (5 sets of tweezers in this preferred embodiment) vertically disposed at regular intervals, the tweezers in each set horizontally supporting a wafer at the bottom thereof. The wafer transfer device 10 is moved up and down by an elevator 16 including a feed screw mechanism.

As illustrated in FIG. 2, on a left wall of the rear side of the housing 2 is disposed a clean unit 17 for spraying clean air to the boat 9. Further, at a left side of the center portion of the housing 2 is provided a wafer stocker 18 having a similar configuration as the boat 9. The wafer stocker 18 stores a plurality of side dummy wafers thereon.

Referring to FIGS. 1 to 3, a wafer loading/unloading opening 20 through which the wafers (W) are transferred into and from the housing 2 is prepared on a central portion of a front wall thereof. At the wafer loading/unloading opening 20 is installed a pod opener 21. The pod opener 21 has a pod loading port 22 for mounting a pod 26 and a pod door removing/restoring device 23 for opening and closing an opening of the pod 26 mounted on the pod loading port 22 by removing and restoring a door 27 of the pod 26.

As illustrated in FIGS. 1 to 3, a first and a second pod stage 24 and 25 are respectively installed at a left side and a right side of the pod loading port 22 so as to receive the pod 26 thereon. The pods 26 are supplied to or removed from the first and the second pod stage 24 and 25 by a pod conveying system (not shown) such as a rail guided vehicle (RGV) equipped with a pod transfer mechanism, an automatic guided vehicle (AGV) equipped with a pod transfer mechanism and a personnel guided vehicle (PGV) equipped with a manual pod transfer mechanism, and the like. At an upper portion of the front region of the housing 2, there is installed a pod carrying device 30 (illustrated in detail in FIG. 4) for transferring the pod 26 between the pod opener 21 and either one of the first and the second pod stage 24 and 25.

Figure 4:
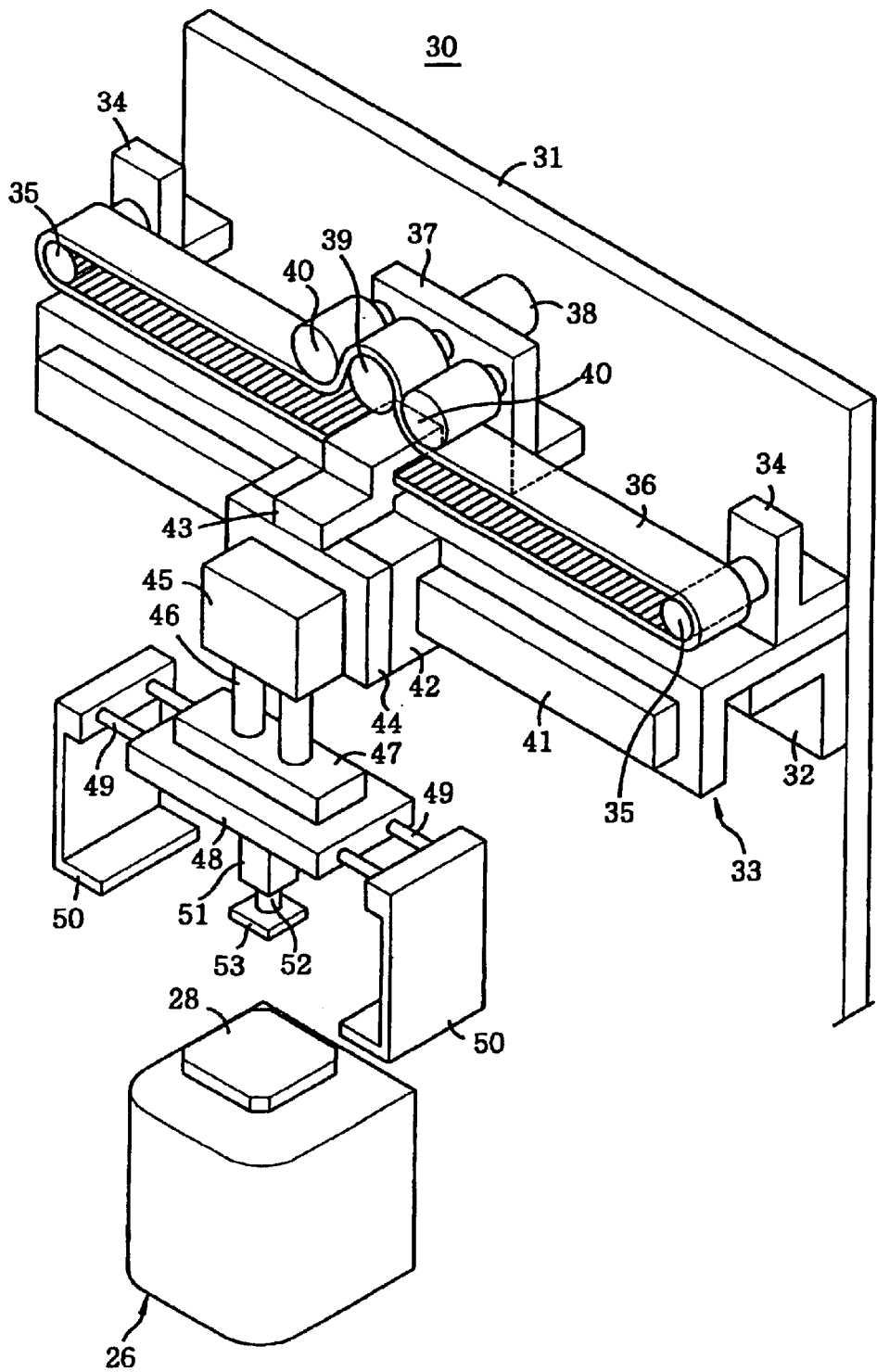
FIG. 4 sets forth a perspective view of a pod transfer device.

Referring to FIG. 4, there is provided a perspective view of the pod carrying device 30. The pod carrying device 30 has an installation plate 31 vertically disposed and elongated in a left-right direction. At an upper portion of the front surface of the installation plate 31 is installed an angle shaped base plate 33, which is horizontally arranged in the left-right direction and fixed by a bracket 32. A pair of brackets 34 are installed at a left and a right end of the upper surface of the base plate 33, and a pulley 35 is rotatably installed at each of the brackets 34. A timing belt 36 is movably wound between the two pulleys 35. Halfway between the two brackets 34 is fixed a central bracket 37 to which a driving pulley 39 rotated by a servomotor 38 is connected. The driving pulley 39 is disposed between an upper travel portion and a lower travel portion of the timing belt 36 and a lower surface of the upper travel portion of the timing belt 36 is wound around the driving pulley 39 such that the timing belt 36 is moved when the driving pulley 39 rotates. The central bracket 37 also has two tension pulleys 40 rotatably installed at a left and a right side of the driving pulley 39. The tension pulleys 40 are in pressurized contact with an upper surface of the upper travel portion of the timing belt 36, so that the timing belt 36 is pushed toward the driving pulley 39 with an appropriate tension applied thereto.

A linear guide rail 41 is horizontally installed in the left-right direction on a vertical member of the angle shaped base plate 33 and a conveying block 42 is installed on the guide rail 41 in such a manner as to be able to move in the left-right direction. On a top surface of the conveying block 42 is prepared a connecting piece 43, which is coupled to a central part of the lower travel portion of the timing belt 36. Accordingly, the conveying block 42 is movable in the left-right direction on the guide rail 41 when the timing belt 36 travels.

A first air cylinder 45 having a piston rods 46 is installed at the conveying block via a bracket 44 in a vertical downward direction. A second air cylinder 48 is connected to the piston rods 46 via a bracket 47 and is horizontally disposed in the left-right direction. The second air cylinder 48 has two piston rods 49 respectively installed at two opposite ends thereof, wherein the piston rods 49 retract and extend in the left-right direction. At the distal ends of the piston rods 49 at each end of the second air cylinder 48, there is installed a lower clamping element 50. The two lower clamping elements 50 horizontally approach to spaces right below the handle of the pod 28 to face a bottom surface of the handle 28 when the piston rods 49 retract.

Further, a third air cylinder 51 having piston rod 52 is installed at a central part of a lower surface of the second air cylinder 48 in a vertical downward direction. At the end of the piston rod 52 is installed an upper clamping element 53, which is brought into contact with a top surface of the handle 28 of the pod 26 when the piston rod 52 extends and clamps the handle 28 of the pod 26 together with the lower clamping elements 50. The pod carrying device 30 configured as described above is covered by a case 54, as shown in FIG. 1.

Referring to FIGS. 5A to 6E, a pod loading/unloading process and a wafer charging/discharging process in accordance with a first embodiment of the present invention will be described hereinafter, wherein the small-batch type CVD system configured as described above is used in forming films on wafers.

A pod 26A provided on the first pod stage 24 (hereinafter, "a first pod") contains 25 sheets of side dummy wafers representing substrates not to be used to produce actual devices and a pod 26B supplied to the second pod stage 25 (hereinafter, "a second pod") contains 25 sheets of product wafers serving as substrates for producing actual devices.

Figure 6A:
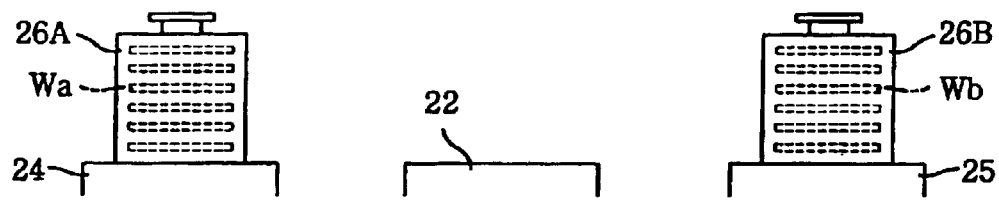
FIGS. 6A to 6E offer front views for illustrating wafer charging and discharging processes in accordance with the first embodiment of the present invention.
Figure 6B:
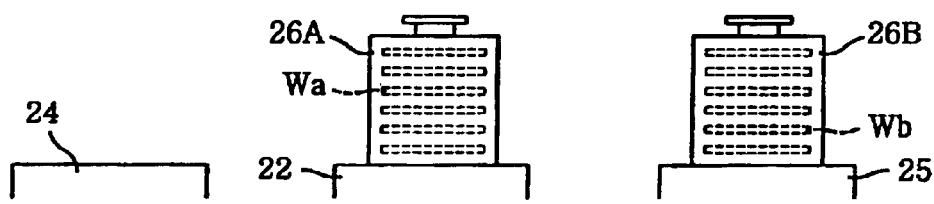

The first and the second pod 26A and 26B are respectively provided onto the first and the second pod stage 24 and 25 by using the pod conveying system. Thereafter, the first pod 26A conveyed to the first pod stage 24 is clamped and picked up by the pod carrying device 30 as shown in FIGS. 5A to 5D and transferred to the loading port 22 of the pod opener 21 as illustrated in FIGS. 6A to 6B.

Pod pick-up and put-down process of the pod carrying device 30 will now be described hereinafter with reference to FIGS. 5A to 5D.

The pod carrying device 30 picks up the pod 26 mounted on the first pod stage 24 through a series of operations as follows. First, as shown in FIG. 5A, the upper clamping element 53 is moved to right above the handle 28 of the pod 26 mounted on the first pod stage 24. To be more specific, the driving pulley 39 operated by the servomotor 38 makes the timing belt 36 travel and the timing belt 36 causes in turn the conveying block 42 to move in the left-right direction along the guide rail 41 to locate the upper clamping element 53 to a desired position. Meanwhile, the lower clamping elements 50 prepared are maintained by the piston rods 49 of the second air cylinder 48 to be disposed above the handle 28 of the pod 26 in open state.

Next, as illustrated in FIG. 5B, the upper clamping element 53 and the lower clamping elements 50 in open state are lowered by extending the piston rods 46 of the first air cylinder 45 until the upper clamping element 53 reaches to a position right above the handle 28 and the lower clamping elements 50 approach to positions below the handle 28. While the upper clamping element 53 and the lower clamping elements 50 are lowered, the vertical distance therebetween is maintained intact.

Thereafter, as shown in FIG. 5C, the left and right lower clamping elements 50 are moved into positions right below the handle 28 by retracting the piston rods 49 of the second air cylinder 48. Accordingly, upper surfaces of the end portions of the left and right lower clamping elements 50 become to face a left and a right end portion of a lower surface of the handle 28, respectively, maintaining a slight distance therebetween.

Subsequently, as shown in FIG. 5D, since the end portions of the left and the right lower clamping elements 50 are brought in contact with the left and the right end portion of the lower surface of the handle 28 when the piston rods 46 of the first air cylinder 45 retracts, the pod 26 is picked up by the lower clamping elements 50. Concurrently, the upper clamping element 53 is lowered by extending the piston rod 52 of the third air cylinder 51, so that the handle 28 becomes clamped by the upper clamping element 53 and the lower clamping elements 50. Since the handle 28 of the pod 26 is clamped by the upper clamping element 53 and the lower clamping elements 50 while being transferred, the pod 26 can be moved safely and promptly by the pod carrying device 30.

The pod carrying device 30 transfers the pod 26 whose handle 28 is clamped by the upper clamping element 53 and the lower clamping elements 50 from the first pod stage 24 to a position above the loading port 22 of the pod opener 21. More specifically, the driving pulley 39 operated by the servomotor 38 makes the timing belt 36 travel and the timing belt 36 allows in turn the conveying block 42 to travel in the left-right direction along the guide rail 41. Accordingly, the pod 26 can be successfully transferred to the position right above the loading port 22.

Then, the pod 26 is put down on the loading port 22 by the pod carrying device 30 operating as follows in a reverse sequence of the processes described above. Referring to FIG. 5C, the upper clamping element 53 is slightly lifted by retracting the piston rod 52 of the third air cylinder 51. Then, the left and right lower clamping elements 50 are lowered by extending the piston rods 46 of the first air cylinder 45. As a result, the pod 26 is moved to be mounted on the loading port 22. Referring to FIG. 5B, the left and right lower clamping elements 50 are opened by extending the piston rods 49 of the second air cylinder 48 and moved away from the handle 28. Thereafter, as shown in FIG. 5A, the upper clamping element 53 and the lower clamping elements 50 in open state are lifted by retracting the piston rods 46 of the first air cylinder 45 and returned to a waiting position, wherein the vertical distance between the upper clamping element 53 and the lower clamping elements 50 is remains unchanged while being lifted.

The door 27 of the first pod 26A provided onto the loading port 22 by the above operations of the pod carrying device 30 is separated by the pod door removing/restoring device 23 so that the opening of the first pod 26A is opened and the wafer contained therein can be taken out.

Then, the plurality of side dummy wafers (Wa) accommodated in the first pod 26A are sequentially carried out of the first pod and charged into the boat 9 by the wafer transfer device 10. At this time, the side dummy wafers (Wa) are properly distributed in an upper end part and a lower end part of the boat 9 as can be seen in FIG. 3.

When the side dummy wafers (Wa) in the first pod 26A are completely loaded into the boat 9, the pod door 27 once separated before is remounted to the empty first pod 26A by the pod door removing/restoring device 23. Then, the first pod 26A is returned to the first pod stage 24 from the loading port 22 by the pod carrying device 30, as shown in FIGS. 6B and 6C.

Figure 6C:
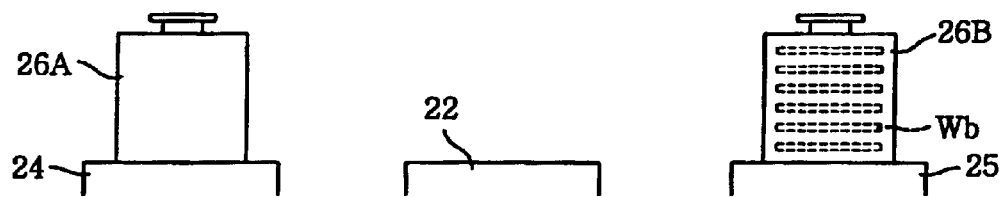
Figure 6D:
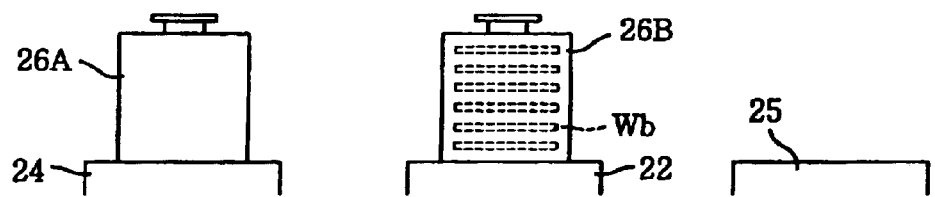

Next, as illustrated in FIGS. 6C and 6D, the second pod 26B is transferred to the loading port 22 from the second pod stage 25 by the pod carrying device 30 which is operated in the same way as described above. Then, the second pod 26B is mounted on the loading port 22 and the door 27 of the second pod 26B is separated by the pod door removing/restoring device 23, so that the wafers contained in the pod 26B can be taken out.

Figure 6E:
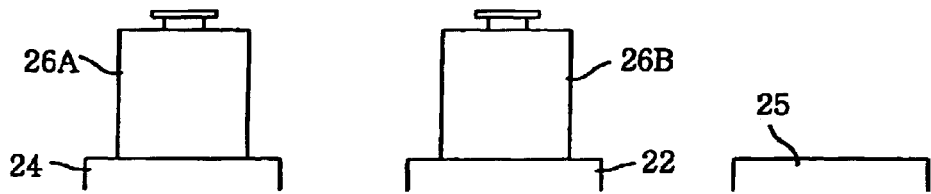

Thereafter, product wafers (Wb) contained in the second pod 26B are loaded onto the boat 9 in sequence by the wafer transfer device 10, as can be seen from FIGS. 6D and 6E. Herein, the product wafers (Wb) are loaded into the boat 9 in such a manner that the product wafers (Wa) are distributed between two groups of the side dummy wafers (Wa) arranged at the upper end part and the lower end part of the boat 9, as shown in FIG. 3.

Upon the completion of the product wafer (Wb) loading process into the boat 9, the empty second pod 26 may remain on the loading port 22. At this time, the door 27 may be remounted on the second pod 26A by the pod door removing/restoring device 23.

When the predetermined total number of, e.g. 30 to 32, side dummy wafers (Wa) and product wafers (Wb) are completely loaded into the boat 9, the boat 9 is lifted by the boat elevator 7 and introduced into a process room of the process tube 4. If the boat 9 reaches an upper limit point, a periphery of an upper surface of the sealing cap 8, which supports the boat 9, airtightly closes the process tube 4, so that the process room is hermetically sealed.

Then, the process room of the process tube 4 is evacuated through the exhaust pipe 6 to reduce the pressure therein down to a predetermined level. Thereafter, the process room is heated by the heater unit 3 to reach to a predetermined temperature. Next, a predetermined flow rate of process gas is supplied into the process room through the gas supply pipe 5. Through such operations, a desired film corresponding to preset process conditions is formed on the product wafers (Wb).

In the first preferred embodiment of the present invention, the number of the product wafers that can be processed during one batch process is set to be equal to or less than the maximum number of product wafers that can be contained in one product substrate carrier, i.e., the second pod 26B. Further, all of the product wafers contained in the one product substrate carrier, i.e., the second pod 26B, is set to be processed in the process room of the process tube 4 at the same time. That is, the maximum number of product wafers that can be processed in one batch is preferably set to be the same as that which can be accommodated in the second pod 26B. However, if the maximum number of product wafers that can be processed by one batch in the CVD system 1 is set to be, e.g., 20, which is less than 25, the maximum number of product wafers that can be accommodated in the second pod 26B, the number of product wafers carried by the second pod 26B is controlled to be not greater than 20.

After a predetermined processing time has elapsed, the boat 9 is moved downward by the boat elevator 7 and returned to a waiting position, i.e., a wafer charging/discharging station, with the processed product wafers (Wb) and the side dummy wafers (Wa) kept therein.

When the boat 9 is returned to the waiting position, the processed product wafers (Wb) are first discharged from the boat 9 by the wafer transfer device 10 and carried into the empty second pod 26B that has been waiting on the loading port 22 as shown in FIG. 6E. The processed product wafers (Wb) are preferably unloaded prior to the side dummy wafers (Wa) in order to prevent the processed product wafers (Wb) from being contaminated by the particulates which can be generated during the unloading process of the side dummy wafers (Wa).

After all the processed product wafers (Wb) are carried into the empty second pod 26B, the second pod 26B filled with the processed product wafers (Wb) are closed by the pod door 27 which is remounted thereon by the pod door removing/restoring device 23. Then, as can be seen from FIGS. 6D and 6C, the second pod 26B is transferred from the loading port 22 to the second pod stage 25 through the operations of the pod carrying device 30 described above.

Next, as shown in FIGS. 6C and 6B, the empty first pod 26A that has been waiting on the first pod stage 24 is transferred from the first pod stage 24 to the loading port 22 by the pod carrying device 30 which operates as described above. Subsequently, the door 27 of the first pod 26A is opened by the pod door removing/restoring device 23, and the used side dummy wafers (Wa) are carried from the boat 9 to the empty first pod 26A by the wafer transfer device 10.

Next, the first pod 26A filled with the used side dummy wafers (Wa) are closed by the pod door removing/restoring device 23 and transferred from the loading port 22 to the first pod stage 24 by the pod carrying device 30. Alternatively, the first pod 26A can remain on the loading port 22 waiting for a next charging process without being returned to the first pod stage 24.

Meanwhile, the second pod 26B returned to the second pod stage 25 along with the processed product wafers (Wb) contained therein is then transferred by the conveying system to a next process line for cleaning, a film test, or the like. The processed product wafers (Wb) having films formed thereon are transferred to a lithography process line or an etching process line to be subjected to required treatments. As a result, IC devices are finally produced in accordance with the first embodiment of the present invention. Meanwhile, the first pod 26A returned to the first pod stage 24 while containing therein the used side dummy wafers (Wa) is kept thereon to be repeatedly used for next batch processes as long as the side dummy wafers (Wa) can be reused. However, when degrees of bending or degrees of contamination of the side dummy wafers (Wa) become to exceed a tolerance limit after repeated uses, the first pod 26A containing therein the side dummy wafers (Wa) is transferred by the conveying system from the first pod stage 24 to, e.g., a side dummy wafer exchanging process line, which is one of the process lines for manufacturing the IC devices in accordance with the present invention.

Afterward, the above-described wafer processing method in accordance with the first embodiment are repeated to perform a batch process on everyone of, e.g., 25 product wafers by using the small-batch type CVD system. As a result, IC devices can be produced in accordance with the first embodiment of the present invention.

Following effects can be provided in accordance with the first embodiment of the present invention as described above.

1) By setting the number of product wafers to be less than 25 sheets for one batch process, the small-batch type CVD system only needs to deal with just two pods, a first pod carrying product wafers and a second pod carrying side dummy wafers. Accordingly, a tact time can be considerably reduced.

2) By using a small number of pods, the small-batch type CVD system can be minimized. Thus, initial costs or running costs of the CVD system can be greatly diminished and a footprint can also be reduced to thereby efficiently utilize the clean room.

3) By reducing the number of side dummy wafers needed for one batch process, initial costs or running costs involved with the side dummy wafers can be largely curtailed.

4) A first and a second pod stage are respectively installed at a left and a right side of the loading port, and the pods are transferred between the loading port and the pod stages by the pod transfer device. This system eliminates the need for shelves for temporarily holding the pods, thereby further diminishing initial costs or running costs of the substrate processing apparatus.

5) By installing the pod transfer device right above the pod opener and the pod stages, the efficiency of the small-batch type CVD system can be improved without increasing the floor area.

6) The pod transfer device clamps the pods by using a clamping device having an upper clamping element and a lower clamping element while carrying the pods. Accordingly, the pods can be safely delivered without being dropped on the way and thus the wafers contained in the pods can also be safely carried without any damage caused.

7) By installing the loading port and the pod stages at the outside of the housing, it is prevented for any contaminants to enter the inside of the housing and the cleanliness of the housing can be effectively kept. As a result, quality and reliability of the wafer processing method and IC manufacturing method can be improved.

Figure 7:
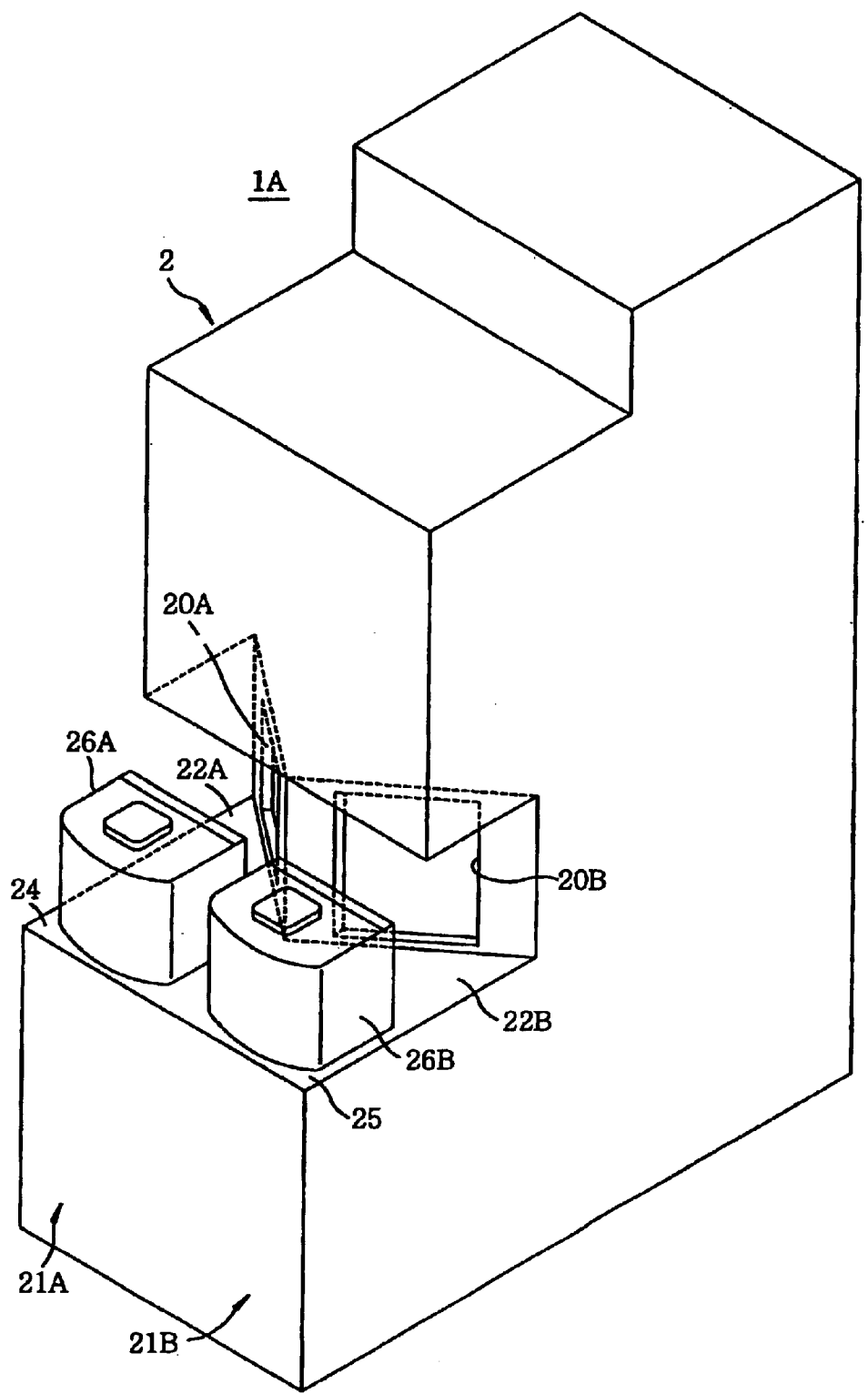
FIG. 7 shows a perspective view of a small-batch type CVD system in accordance with a second embodiment of the present invention.
Figure 8:
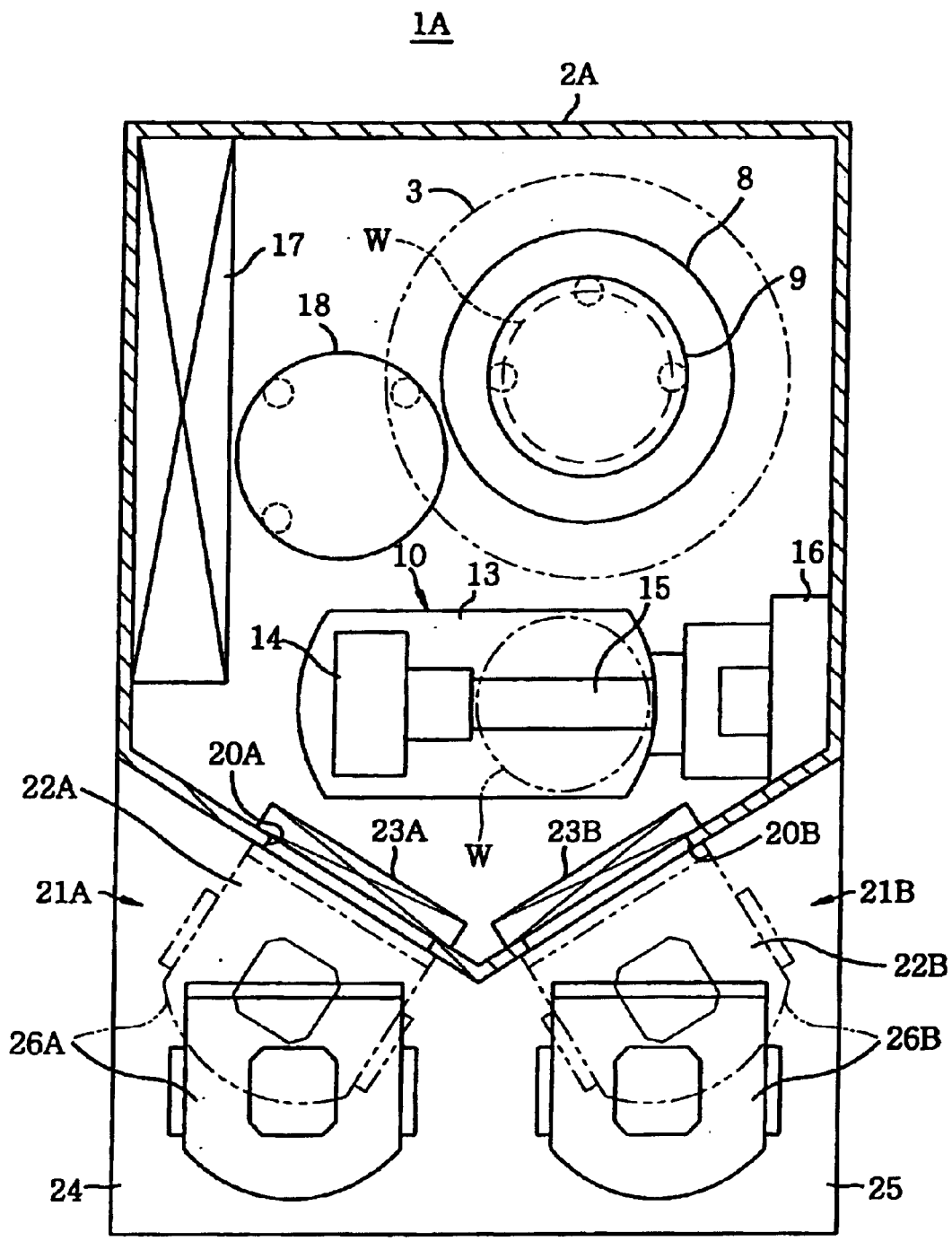
FIG. 8 presents a plan view of the small-batch type CVD system shown in FIG. 7.
Figure 9:
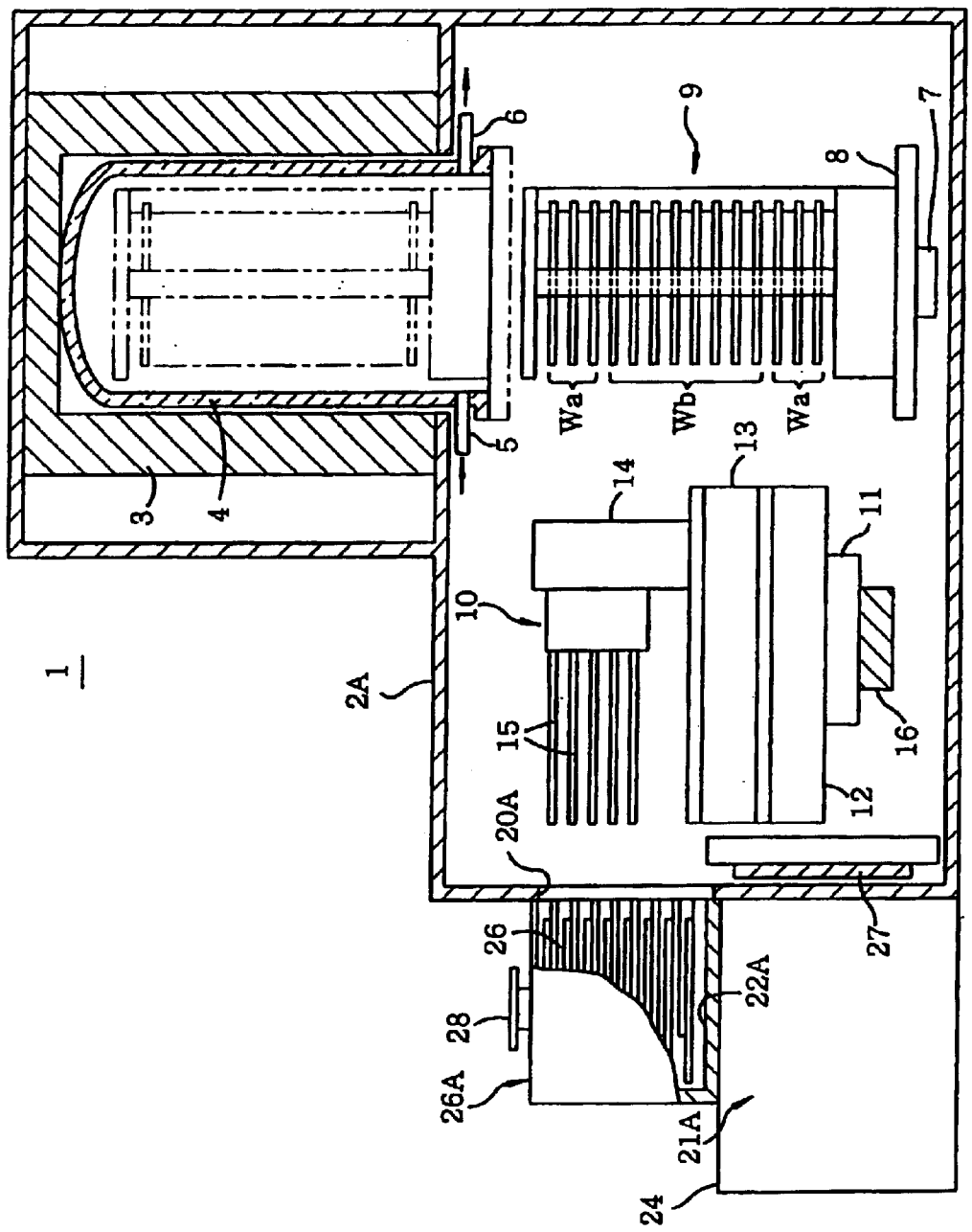
FIG. 9 represents a cross-sectional view of the small-batch type CVD system shown in FIG. 7.

FIG. 7 is a perspective view of a small-batch type CVD system in accordance with a second embodiment of the present invention. Referring to FIG. 8 and FIG. 9, there are respectively illustrated a plan view and a cross-sectional view of the CVD system shown in FIG. 7.

The small-batch type CVD system 1A in accordance with the second preferred embodiment is identical to the small-batch type CVD system 1 of the first embodiment excepting that: the pod carrying device 30 is not provided; instead, a first wafer loading/unloading opening 20A and a second wafer loading/unloading opening 20B are provided on a front wall of a housing 2, respectively facing a first pod stage 24 and a second pod stage 25; and a first pod opener 21A and a second pod opener 21B are respectively installed on the first and the second wafer loading/unloading opening 20A and 20B.

Hereinafter, with the explanation of the operation of the small-batch type CVD system 1A, a film-formation process in accordance with the second embodiment of the present invention will be described, particularly focusing on characteristic features thereof, i.e., a pod loading/unloading process and a wafer charging/discharging process. A pod provided on the first pod stage 24 (hereinafter, "a first pod 26A") contains 25 sheets of side dummy wafers representing substrates not to be used to produce actual devices and a pod provided on the second pod stage 25 (hereinafter, "a second pod 26B") contains 25 product wafers serving as substrates for producing actual devices. The first and the second pod 26A and 26B are provided onto the first and the second pod stage 24 and 25, respectively, by a pod conveying system.

As illustrated in an imaginary line in FIG. 8 and as a solid line in FIG. 9, the first pod 26A provided to the first pod stage 24 is pushed by a pod transfer device (not shown) toward the first wafer loading/unloading opening 20A to be in pressurized contact therewith. Then, a door 27 of the first pod 26A is separated by a pod door removing/restoring device 23A prepared at the first pod opener 21A so that the opening of the first pod 26A is opened and the wafer contained therein can be taken out.

A plurality of side dummy wafers (Wa) contained in the first pod 26A are sequentially carried out of the first pod 26A and charged into a boat 9 by a wafer transfer device 10. At this time, the side dummy wafers (Wa) are properly distributed to be loaded in an upper end part and a lower end part of the boat 9, as shown in FIG. 9.

As shown in the imaginary line in FIG. 8, the second pod 26B provided to the second pod stage 25 is transferred by the pod transfer device (not shown) toward the second wafer loading/unloading opening 20B to be in pressurized contact therewith. Then, a door 27 of the second pod 26B is separated by a pod door removing/restoring device 23B prepared at the second pod opener 21B, so that the opening of the second pod 26B is opened and the wafers contained therein can be taken out.

A plurality of product wafers (Wb) contained in the second pod 26B are loaded into the boat 9 in sequence by the wafer transfer device 10. Herein, the product wafers (Wb) are loaded into the boat 9 in a manner that the product wafers (Wb) are distributed between two groups of the side dummy wafers (Wa) arranged at the upper end part and the lower end part of the boat 9, as shown in FIG. 9.

When the predetermined total number of, e.g., 30 to 32, side dummy wafers (Wa) and product wafers (Wb) are all loaded into the boat 9, the boat 9 is lifted by a boat elevator 7 and introduced into a process room within a process tube 4. If the boat 9 reaches an upper limit point, a periphery of an upper surface of a sealing cap 8, which supports the boat 9, airtightly closes the process tube 4, so that the process room is hermetically sealed.

Then, the process room of the process tube 4 is evacuated through an exhaust pipe 6 to reduce the pressure therein down to a predetermined level. Thereafter, the process room is heated by a heater unit 3 to reach to a predetermined temperature. Next, a predetermined flow rate of process gas is supplied into the process room through a gas supply pipe 5. Through such operations, a desired film corresponding to pre-established process conditions is formed on the product wafers (Wb). The number of the product wafers that can be processed during one batch process is set to be equal to or less than the maximum number of product wafers that can be accommodated by one product substrate carrier, i.e., the second pod 26B. Further, all of the product wafers contained in one product substrate carrier, i.e., the second pod 26B, is set to be processed in the process room at the same time as in the first preferred embodiment of the present invention.

After a predetermined processing time has elapsed, the boat 9 is lowered down by the boat elevator 7 and returned to a waiting position with the processed product wafers (Wb) and the side dummy wafers (Wa) kept therein.

When the boat 9 is returned to the waiting position, the processed product wafers (Wb) are first discharged from the boat 9 by the wafer transfer device 10 and carried into the empty second pod 26B that has been waiting on the second pod opener 21B.

After all the processed product wafers (Wb) are carried into the empty second pod 26B, the second pod 26B filled with the processed product wafers (Wb) are closed by the pod door 27 which is remounted thereon by the pod door removing/restoring device 23B. Then, as can be seen from the solid lines in FIGS. 7 and 8, the second pod 26B is transferred from the second wafer loading/unloading opening 20B to the second pod stage 25 by the pod transfer device prepared at the second pod opener 21B.

Next, the used side dummy wafers (Wa) are carried from the boat 9 to the empty first pod 26A waiting on the first pod opener 21A by the wafer transfer device 10.

When all the used side dummy wafers (Wa) are completely carried into the first pod 26A, the door 27 of the first pod 26A is closed by the pod door removing/restoring device 23A and the first pod 26A is returned from the first wafer loading/unloading opening 20A to the first pod stage 24 by the pod transfer device of the first pod opener 21A.

Meanwhile, the second pod 26B returned to the second pod stage 25 along with the processed product wafers (Wb) contained therein is then transferred by the pod conveying system to a next process line for cleaning, a film test, or the like. The processed product wafers (Wb) having films formed thereon are transferred to a lithography process line or an etching process line to be subjected to required treatments. As a result, IC devices can be finally produced in accordance with an IC manufacturing process of the present invention. Meanwhile, the first pod 26A returned to the first pod stage 24 while carrying therein the used side dummy wafers (Wa) is kept thereon to be repeatedly used for next batch processes as long as the side dummy wafers (Wa) can be reused. However, when degrees of bending or degrees of contamination of the side dummy wafers (Wa) become to exceed a tolerance limit after repeated uses, the first pod 26A containing therein the side dummy wafers (Wa) is transferred by the conveying system from the first pod stage 24 to, e.g., a side dummy wafer exchanging process line, which is one of the process lines for manufacturing the IC devices in accordance with the present invention.

Afterward, the above-described wafer processing method in accordance with the second embodiment are repeated to perform a batch process for everyone of, e.g., 25 product wafers by using the small-batch type CVD system. As a result, IC devices can be produced in accordance with the IC manufacturing process of the present invention.

In accordance with the second embodiment of the present invention, the tact time can be further shortened since the pod transfer device is not used.

The present invention is not limited to the above-described preferred embodiments but can be varied in various ways if required.

For example, the side dummy wafers (Wa) are carried by the pod 26 in the above-stated preferred embodiments. However, the side dummy wafers (Wa) can be accommodated by a wafer stocker 18, a storage of the side dummy wafers. In such case, the side dummy wafers (wa) are transferred between the boat 9 and the wafer stocker 18. Accordingly, it is not required to transfer the side dummy wafers (Wa) to a pod outside of the housing 2 for every stage, so that the tact time can be further diminished. The side dummy wafers (Wa) are repeatedly used until they are exchanged because their degree of bending or degree of contamination exceeds a tolerance limit.

Further, in the preferred embodiments, one dummy wafer pod and one product wafer pod are used and thus 25 sheets or less of product wafers contained in the product wafer pod can be processed during one batch process. However, by using the wafer stocker 18 for storing the dummy wafers thereon, two product wafer pods can be employed to provide product wafers, so that a maximum 50 sheets of product wafers can be processed during one batch process.

Still further, though the present invention has been illustrated with reference to a CVD system used for forming a CVD film on wafers in the preferred embodiments, the present invention can also be applied to a variety of substrate processing systems including a film-formation system for forming oxide films, insulation films or metal films on wafers and a thermal processing equipment for forming oxide films on wafers, diffusing impurities on wafers or reflowing/annealing for an activation or a planarization of carriers after ion injection.

In addition, though the present invention has been used in manufacturing IC devices in the preferred embodiments, the present invention can also be utilized to produce all kinds of semiconductor devices such as a transistor, a diode, a capacitor, an optical semiconductor device, a hybrid IC device, and the like.

Further, substrates to be processed can be photo masks, printed circuit boards, liquid crystal panels, and so forth other than semiconductor wafers.

As described above, the present invention can provide a QTAT (quick turn around time) type substrate processing apparatus capable of processing substrates in small amounts at a reduced cost.

While the present invention has been shown and described with respect to the preferred embodiments, it will be understood by those skilled in the art that various changes and modifications may be made without departing from the spirit and scope of the invention as defined in the following claims.

What is claimed is:

1. A method for manufacturing semiconductor devices in a substrate process apparatus, comprising the steps of:
   (a) providing a product substrate carrier accommodating therein a maximum M number of product substrates to a carrier stage;
   (b) charging in a boat the product substrates accommodated in the product substrate carrier;
   (c) loading the product substrates charged in the boat into a process tube; and
   (d) performing a batch process to the product substrates loaded in the process tube,
   wherein the number of the product substrates processed in the process tube at one time is set to be less than or equal to M and all the product substrates contained in the product substrate carrier are processed at a same time.

2. The method of claim 1, wherein the M number is 25 or less.

3. The method of claim 1, wherein the product substrate carrier has a door, and the method further comprising, between the steps (a) and (b), the step of (a1) opening the door of the product substrate carrier.

4. The method of claim 3, further comprising, between the steps (a) and (a1), the step of (a2) transferring the product substrate carrier from the carrier stage to a loading port where the door is opened.

5. The method of claim 1, further comprising, before the step (c), the step of (e) charging dummy substrates in the boat, and wherein the dummy substrates are loaded into the process tube as well at the step (c).

6. The method of claim 5, wherein the step (e) includes the steps of (e1) providing a dummy substrate carrier accommodating therein the dummy substrates to the carrier stage and (e2) charging in the boat the dummy substrates accommodated in the dummy substrate carrier.

7. The method of claim 6, wherein the dummy substrate carrier has a door, and the method further comprising, between the steps (e1) and (e2), the steps of (e3) opening the door of the dummy substrate carrier.

8. The method of claim 6, wherein the dummy substrate carrier has a door, and the method further comprising, between the steps of (e1) and (e2), the steps of (e4) transferring the dummy substrate carrier from the carrier stage to a loading port where the door is opened and (e3) opening the door of the dummy substrate carrier.

9. The method of claim 1, wherein, the product substrate carrier at the step (a) is provided from another substrate process apparatus.

10. A method for manufacturing semiconductor devices, comprising the steps of:

(f) providing a product substrate carrier to a first substrate process apparatus from a second substrate process apparatus, the product substrate carrier accommodating therein a maximum M number of product substrates;

(g) charging the product substrates accommodated in the provided product substrate carrier in a process tube of the first substrate process apparatus;

(h) performing a batch process to the product substrates charged in the process tube, wherein the number of the product substrates processed in the process tube at one time is set to be less than or equal to M and all the product substrates contained in the product substrate carrier are processed at a same time.

11. The method of claim 10, wherein the M number is 25 or less.

12. The method of claim 10, wherein the product substrate carrier has a door and the method further comprising, between the step (f) and the step (g), the step of (f1) opening the door of the product substrate carrier.

13. The method of claim 12, further comprising, between the steps (f) and (f1), the steps of (f2) placing the product substrate carrier to a carrier stage and (f3) transferring the product substrate carrier from the carrier stage to a loading port where the door is opened.

14. The method of claim 10, further comprising (g1) charging dummy substrates in the process tube as well at the step (g).

15. The method of claim 14, further comprising, between the steps (f) and (g1), the steps of (f2) providing a dummy substrate carrier accommodating therein the dummy substrates to the first substrate process apparatus.

16. The method of claim 15, wherein the dummy substrate carrier has a door, and the method further comprising, between the steps (f1) and (g1), the step of (f3) opening the door of the dummy substrate carrier.

17. The method of claim 15, wherein the dummy substrate carrier has a door, and the method further comprising, between the steps (f1) and (g1), the steps of (f4) placing the dummy substrate carrier to a carrier stage of the first substrate process apparatus, (f5) transferring the dummy substrate carrier from the carrier stage to a loading port where the door is opened, and (f3) opening the door of the dummy substrate carrier.

* * * * *